United States Patent
Kimura et al.

(10) Patent No.: US 7,830,008 B2
(45) Date of Patent: Nov. 9, 2010

(54) GOLD WIRE FOR CONNECTING SEMICONDUCTOR CHIP

(75) Inventors: Keiichi Kimura, Futtsu (JP); Tomohiro Uno, Futtsu (JP)

(73) Assignee: Nippon Steel Materials Co., Ltd., Tokyo (JP)

( * ) Notice: Subject to any disclaimer, the term of this patent is extended or adjusted under 35 U.S.C. 154(b) by 0 days.

(21) Appl. No.: 11/795,921

(22) PCT Filed: Jan. 24, 2006

(86) PCT No.: PCT/JP2006/001384

§ 371 (c)(1),
(2), (4) Date: Sep. 20, 2007

(87) PCT Pub. No.: WO2006/078076

PCT Pub. Date: Jul. 27, 2006

(65) Prior Publication Data

US 2008/0105975 A1    May 8, 2008

(30) Foreign Application Priority Data

Jan. 24, 2005   (JP)   ............................. 2005-015685
Jan. 6, 2006    (JP)   ............................. 2006-001174

(51) Int. Cl.
   *H01L 23/48*   (2006.01)
(52) U.S. Cl. ............... 257/741; 257/784; 257/E23.025; 420/507; 174/126.1
(58) Field of Classification Search ................. 257/438, 257/741, 784, E23.025; 428/606, 364, 553; 420/507; 174/126.1
See application file for complete search history.

(56) References Cited

U.S. PATENT DOCUMENTS

| | | | | | |
|---|---|---|---|---|---|
| 5,702,814 | A | * | 12/1997 | Hanada et al. | ............... 428/364 |
| 6,103,025 | A | * | 8/2000 | Herklotz et al. | ............. 148/430 |
| 6,165,627 | A | * | 12/2000 | Miyazaki et al. | ............ 428/606 |
| 2005/0013724 | A1 | * | 1/2005 | Ougi et al. | .................. 420/532 |

FOREIGN PATENT DOCUMENTS

| | | |
|---|---|---|
| JP | 58-096741 A | 6/1983 |
| JP | 58-96741 A | 6/1983 |
| JP | 58-154242 A | 9/1983 |
| JP | 1-198438 | 8/1989 |
| JP | 04-284821 A | 10/1992 |
| JP | 4-284821 A | 10/1992 |
| JP | 9-36161 A | 2/1997 |
| JP | 9-74113 A | 3/1997 |
| JP | 2621288 | 4/1997 |
| JP | 2661247 | 6/1997 |
| JP | 2680414 | 8/1997 |
| JP | 2766706 | 4/1998 |
| JP | 2773202 | 4/1998 |
| JP | 2814660 | 8/1998 |
| JP | 3337049 | 8/2002 |

* cited by examiner

*Primary Examiner*—Jerome Jackson, Jr.
*Assistant Examiner*—Dale Page
(74) *Attorney, Agent, or Firm*—Kenyon & Kenyon LLP

(57) ABSTRACT

Gold wire for connecting a semiconductor chip basically containing praseodymium in 0.0004 mass % to 0.02 mass % in range and, considering the bonding characteristics, containing beryllium or aluminum or both in limited ranges and, considering the precipitates formed in the gold wire, further containing auxiliary additive elements of calcium, lanthanum, cerium, neodymium, and samarium in limited ranges.

8 Claims, No Drawings

GOLD WIRE FOR CONNECTING SEMICONDUCTOR CHIP

TECHNICAL FIELD

The present invention relates to gold wire for connecting a semiconductor chip.

BACKGROUND ART

The bonding wire used as a mounting material of a semiconductor chip connects a semiconductor chip and external metal terminals. At the present time, almost all such wire is made using a material mainly comprised of gold. The major reason for this is that semiconductor chips and external terminals are connected using the high throughput and high productivity technique known as "ball bonding".

"Ball bonding" is the method of bonding melting one end of a metal wire to form a ball, pressing this against one electrode to bond with it, and press bonding the side surface of the wire to another electrode as it is.

Here, the ball bonding will be referred to as the "first bonding" and the bonding for press bonding the side of the wire to an electrode will be referred to as "second bonding".

The reason why gold is used so much is that there is little deterioration of the first and second bondabilities due to surface oxidation of the balls or wire and bonding in the atmosphere is easy.

The bonding wire is increased in strength by work hardening by wire drawing, but with pure gold, a sufficient mechanical strength is not obtained, so trace amounts of different elements are added. However, the generally used additive elements easily oxidize at the time of forming the balls, so if added in large amounts, they degrade the bondability.

Therefore, it is being sought to obtain a high strength without adding these elements as much as possible. In the second bonding as well, the effect of the additive elements is felt.

In general, the less the additive elements, the less the surface oxidation of the wire, so the better the second bondability obtained.

In recent years, the mounting sizes of semiconductor chips have become smaller, the sizes of electrode pads have become smaller, and the pitches have become narrower. Along with this, the bonding wire has also been reduced in thickness. Gold wire of a diameter of 15 μm is also starting to be used.

If the wire size becomes smaller, in wire production, the wire will not be strong enough and will break at the time of drawing and maintenance of the loop at the time of bonding, resin sealing, and other mounting will become difficult, so the gold wire has to be increased in strength.

As additive elements for raising the gold wire strength, calcium and rare earth elements (lanthanides including scandium and yttrium) may be mentioned. Numerous patents have been disclosed relating to additive elements (for example, Japanese Patent Publication (A) No. 58-96741, Japanese Patent Publication (A) No. 58-154242, Japanese Patent Publication (A) No. 4-284821, Japanese Patent No. 2621288, Japanese Patent No. 2661247, Japanese Patent No. 2680414, Japanese Patent No. 2766706, Japanese Patent No. 2773202, Japanese Patent No. 2814660, Japanese Patent No. 3337049).

However, among these, the rate of contribution to the strength is not clear. For example, Japanese Patent Publication (A) No. 58-96741 reports the strength of materials by lanthanum, cerium, praseodymium, neodymium, samarium, europium, gadolinium, terbium, dysprosium, holmium, erbium, thulium, ytterbium, lutetium, scandium, and yttrium alone or by composite addition, but no difference of these elements with respect to strength can be recognized.

Further, Japanese Patent Publication (A) No. 58-154242 discloses that cerium family rare earth elements of lanthanum, cerium, praseodymium, neodymium, and samarium improve the ordinary temperature and high temperature tensile strength, but their actions are equal.

On the other hand, Japanese Patent No. 3337049 describes that among the rare earth elements, europium is superior to calcium and other rare earth elements in reliability of the ball neck. Here, praseodymium is an additional ingredient. When not contained together with any of platinum, silver, magnesium, and europium, no effect is recognized in the reliability of the ball neck.

The contribution to strength differs even among the rare earth elements, so in terms of raising the strength, there are optimal combinations. There can be said to be additive elements suitable for this, but as explained above, there are various reports on the contribution of additive elements to strength and the situation is not clear.

DISCLOSURE OF THE INVENTION

The present invention provides gold wire for connection of a semiconductor chip where both bondability and mechanical properties are achieved.

The present invention was made as a result of intensive study for solving the above problems in the prior art and provides gold wire for connecting a semiconductor chip having as its basic ideas (x) to basically raise the strength by as low an amount of addition as possible by in particular including praseodymium, (y) consider the strength, bondability, and precipitates formed in the gold wire and include calcium, lanthanum, cerium, neodymium, europium, and samarium in limited ranges as auxiliary additive elements, and (z) include beryllium and aluminum in limited ranges as elements for raising the circularity of the ball shape at the time of ball bonding to improve bondability.

Further, the present invention specifically has the following as its gist:

(1) A gold wire for connecting a semiconductor chip characterized in that a content of praseodymium is 0.0004 mass % to 0.02 mass %.

(2) A gold wire for connecting a semiconductor chip characterized in that a content of praseodymium is 0.0004 mass % to 0.004 mass %.

(3) A gold wire for connecting a semiconductor chip characterized in that a content of praseodymium is over 0.004 mass % to 0.02 mass % and in that in any cross-section in the gold wire, a density of second phases of a long size of 0.5 μm or more is 10/mm$^2$ or less.

(4) A gold wire for connecting a semiconductor chip characterized by containing 0.0004 mass % to 0.004 mass % of praseodymium and containing at least one of 0.0002 mass % to 0.02 mass % of calcium, 0.0002 mass % to 0.0033 mass % of cerium, 0.0002 mass % to 0.0033 mass % of neodymium, 0.0002 mass % to 0.0033 mass % of samarium, 0.0002 mass % to 0.0008 mass % of lanthanum, and 0.0002 mass % to 0.002 mass % of europium.

(5) A gold wire for connecting a semiconductor chip characterized by containing 0.0004 mass % to 0.02 mass % of praseodymium, containing at least one element of 0.0002 mass % to 0.02 mass % of calcium, 0.0002 mass % to 0.0033 mass % of cerium, 0.0002 mass % to 0.0033 mass % of neodymium, 0.0002 mass % to 0.0033 mass % of samarium, 0.0002 mass % to 0.003 mass % of lanthanum, and 0.0002 mass % to 0.003 mass % of europium and in that in any cross-section in the gold wire, a density of second phases of a long size of 0.5 μm or more is 10/mm² or less.

(6) A gold wire for connecting a semiconductor chip as set forth in any one of (1) to (5), characterized in that said content of praseodymium is, by mass ratio, 15% or more of the total content of the calcium and rare earth elements (rare earth elements indicating lanthanide elements including yttrium).

(7) A gold wire for connecting a semiconductor chip as set forth in any one of (1) to (6), characterized in that a content of rare earth elements other than said praseodymium, cerium, neodymium, samarium, lanthanum, and europium is 0.0005 mass % or less.

(8) A gold wire for connecting a semiconductor chip as set forth in any one of (1) to (7), characterized by further containing at least one of 0.0002 mass % to 0.0009 mass % of beryllium and 0.0002 mass % to 0.005 mass % of aluminum.

(9) A gold wire for connecting a semiconductor chip as set forth in (8), characterized by further containing 0.0003 mass % to 0.006 mass % of indium.

(10) A gold wire for connecting a semiconductor chip as set forth in any one of (1) to (9), characterized in that the unavoidable impurities of silicon, lead, lithium, and sodium are 0.0014 mass % or less.

(11) A gold wire for connecting a semiconductor chip as set forth in any one of (1) to (10), characterized in that the breakage strength is 210 MPa or more.

(12) A gold wire for connecting a semiconductor chip as set forth in any one of (1) to (11), characterized in that a rate of reduction in cross-section from an ingot in the cast state is 98% or more.

(13) A gold wire for connecting a semiconductor chip as set forth in (12), characterized in that said ingot is an ingot obtained by a one-directional solidification method.

In the gold wire for connecting a semiconductor chip of the present invention, by using praseodymium, which has a large effect of improving the strength by a low concentration, and an auxiliary ingredient comprised of at least one element selected from calcium, lanthanum, cerium, neodymium, europium, and samarium, it is possible to improve the strength of gold wire by a lower amount of addition compared with the case of using another rare earth element.

Further, in the present invention, by limiting the composition of elements, it is possible to secure good bondability and suppress precipitation of secondary phases (precipitates) causing looping defects. Further, by suppressing the precipitation of the secondary phases (precipitates), the opportunities for wire breakage are also reduced, so the present invention provides a metal wire with a high productivity.

Further, in the present invention, by including beryllium and aluminum in the prescribed ranges, the anisotropy of the pressed diameter of the first bond by the ultrasonic waves at the time of ball bonding is reduced and the circularity of the ball is improved. Further, in the present invention, by adding indium in the prescribed range, fluctuations in the pressed size can be reduced.

That is, the present invention uses praseodymium and said auxiliary elements in a composite manner so as to improve the strength, the bondability including the pressed shape, and the looping property, enables bonding by finer wires and bonding between narrower pitches, and enables smaller semiconductor chips.

BEST MODE FOR CARRYING OUT THE INVENTION

The amount of addition of praseodymium depends on the required strength. In general, the greater the additive element, the more the surface of the gold wire or molten balls is oxidized, so the bondability deteriorates, but the strength of the gold wire is improved, therefore the amount of addition of the additive element is determined by the application.

Praseodymium has a greater contribution to strength with respect to the amount added compared with other elements, but in the present invention, the effects of praseodymium are particularly effective in areas where a large strength is required. There is a great difference in bondability between the case of using and not using praseodymium.

In the present invention, to obtain the effects of addition as an essential ingredient, addition of 0.0004 mass % or more is necessary. However, if adding over 0.02 mass %, the deterioration of the bondability due to oxidation of the balls becomes remarkable in the case of ball bonding in the atmosphere.

Further, praseodymium, while not to the extent of lanthanum and europium, sometimes forms precipitates with gold at the time of melting and cooling. The effects on the properties of the gold wire depend on the size of the precipitates and the wire size, but when the size is a long size of 0.5 μm or more able to be observed under an optical microscope and the density is more than 10 per mm², wire breakage at the time of production or defects at the time of bonding are caused.

The precipitates are phases formed by gold and rare earth elements different from the matrix. In some cases, they include calcium.

Normally, in the case of gold bonding wire, the solute element has a concentration in the matrix of several tens of mass ppm to several mass % and is dissolved in the gold. As opposed to this, the precipitate has a mass element concentration of 10 mass % atomic % or more. The compounds such as the intermetallic compounds and amorphous material etc. are different in crystal structure from the gold.

The precipitates do not dissolve in the gold but remain as formed in the solidification and cooling. Therefore, while the precipitated state will differ depending on the melting, solidification, cooling, and other heat treatment conditions, in the present invention, the compositions are limited to ones which will not form precipitates even under ordinary solidification conditions not requiring forced cooling devices or other special devices, that is, even with ingot casting by a low cost method.

When trying to obtain a single phase by a general melting furnace not provided with a forced cooling mechanism and having a cooling rate of 200° C./min or less, the content of praseodymium is preferably 0.004 mass % or less under conditions of cooling by a natural cooling furnace. However, when using a one-directional solidification furnace, this does not apply. Casting is possible without forming precipitates in a range up to 0.02 mass %.

Here, the "one-directional solidification method" is the method of solidifying a melt in a space with a substantial temperature gradient. The method of giving a temperature gradient to the molten metal itself and cooling this to below the solidification point or the method of forming a zone with a temperature gradient and passing the molten metal through it may be used.

As typical one-directional solidification methods, there are zone melting and continuous casting. Even in an ordinary furnace, there is some temperature gradient, but the "one-directional solidification method" here means crystal grains of an aspect ratio of crystal grains after solidification of 3 or more occupying a volume of 80% or more of the entirety.

As an element having an action for raising the strength after praseodymium, calcium may be mentioned. Calcium forms precipitates with difficulty, so can be added up to 0.02 mass % where the bondability deteriorates due to oxidation.

Lanthanum, cerium, neodymium, europium, and samarium have smaller contributions to strength than praseodymium, but can be used as additive elements having the action of improving the strength.

Cerium, neodymium, and samarium form precipitates with difficulty, so can be added up to 0.02 mass % where the bondability deteriorates due to oxidation. In some cases, the amounts of addition can be increased over praseodymium.

However, cerium, neodymium, and samarium have smaller effects with regard to strength compared with praseodymium and calcium and should be used in an auxiliary manner. Further, compared with calcium, oxidation is severe, so a content of 0.0033 mass % or less is preferable.

Lanthanum is an additive element able to easily form precipitates, so when trying to produce an ingot for the gold wire in a usual melting furnace, auxiliary use in an amount of 0.0008 mass % or less is preferable. When using the one-directional solidification method, addition up to 0.003 mass % is possible.

Europium, for the same reason, is preferably used in an amount of 0.002 mass % or less in a usual solidification furnace. Further, in a one-directional solidification furnace, use in 0.003 mass % or less is preferable.

From the viewpoint of the deterioration of the bondability by oxidation, the total amount of the praseodymium, calcium, lanthanum, cerium, neodymium, europium, and samarium is preferably 0.02 mass % or less.

When the auxiliary ingredients of calcium, lanthanum, cerium, neodymium, europium, and samarium are deliberately added as auxiliary ingredients, 0.0002 mass % or more is necessary from the viewpoint of the precision of analysis and management of fluctuations able to be industrially applied.

The contribution of calcium, lanthanum, cerium, neodymium, europium, and samarium to strength per amount added is inferior to that of praseodymium when alone, but as shown in the examples, when adding these in addition to praseodymium, sometimes an effect equal to or greater than that when adding praseodymium alone is exhibited.

That is, by composite addition of at least one element selected from calcium, lanthanum, cerium, neodymium, europium, and samarium in limited ranges in addition to praseodymium, the strength increases by a low amount of addition, the formation of precipitates is also suppressed, and gold wire with a high bonding strength can be produced.

In particular, when adding calcium in addition to praseodymium, further when adding neodymium, and further when adding lanthanum or cerium in addition to praseodymium, the strength and bonding properties are good.

When combining praseodymium and calcium and not adding other rare earth elements, a mass of praseodymium with respect to the total mass of praseodymium and calcium is preferably 15% or more, in particular 40% or more.

Gold wire to which neodymium is added in an amount of 0.001 mass % or more has the effect of becoming resistant to damage at the part called the "neck" of the wire right above the pressed ball when forming a loop after bonding.

This damage, called "neck damage", is a phenomenon arising due to the capillary operation for forming bends in the wire for looping. Prevention of this damage is an effect obtained by adding neodymium to praseodymium.

In addition, as ingredients used in an auxiliary manner to praseodymium to improve the strength, lanthanum and cerium may be mentioned.

When combining praseodymium and lanthanum and not adding other rare earth elements, when the mass of praseodymium with respect to the total mass of praseodymium and lanthanum is 15% or more, in particular 75% or more, a good strength is obtained.

In the case of cerium, when 15% or more, in particular when 25% or more, a good strength is obtained.

When combining two or more elements selected from calcium, lanthanum, cerium, neodymium, europium, and samarium and praseodymium, if the mass of the praseodymium with respect to the total mass of the calcium and rare earth element is 15% or more, a high strength is obtained.

To realize high density mounting with a narrow pitch between pads, in addition to the methods of increasing the strength for realizing thinner wires and increasing the bonding strength, it is necessary to control the ball pressed size and pressed shape of the first bond.

Beryllium and aluminum improve the circularity of the ball at the time of ball bonding and enable bonding for narrower pitches.

In particular, when making the size of the gold wire small, it is necessary to increase the amount of the additive elements to augment the strength, but in this case, sometimes the circularity of the pressed ball is harmed by the oxidation of the ball. This has the effect of suppressing this.

Specifically, ultrasonic waves are applied at the time of bonding to keep the pressed size of the ball from extending in the direction of application of the ultrasonic waves and further to keep petal shaped irregularities from being formed. Further, these elements increase the hardness of the ball, so the pressed size itself becomes smaller. Further, they have the effect of improving the bonding strength.

Beryllium has a larger action than aluminum, but easily oxidizes and further is large in diffusion speed, so oxides easily form on the surface of the gold wire. As a result, the second bondability is sometimes degraded.

Further, even when forming a ball at the time of bonding, oxides easily form on the ball surface. From this viewpoint, the amount of addition of beryllium is preferably 0.0009 mass % or less. If in this range, the above advantage is great for the first bondability.

Aluminum does not have as large an effect as beryllium in increasing the circularity of the ball, but the diffusion speed is not as fast as beryllium, so causes little surface oxidation.

Therefore, the allowable amount of addition is larger than beryllium. In particular, when a good second bondability is required, it is possible to use this to replace part or all of the beryllium.

However, if adding a large amount of aluminum, this degrades the drawability in the production process, so the amount of addition is preferably made 0.005 mass % or less.

In particular, by combining beryllium and aluminum for use, it is possible to obtain gold wire with a good ball shape at the time of bonding and superior in second bondability.

When deliberately adding beryllium and aluminum, 0.0002 mass % or more is necessary from the viewpoint of the industrially applicable precision of analysis and control of variations.

Indium is effective for suppressing variations in the pressed size. In this respect, it differs somewhat from the actions of beryllium and aluminum. Therefore, by combining it with beryllium and aluminum for use, it is possible to obtain a more effective pressed shape.

However, indium is also an easily oxidizing element. While depending on the amount of addition with other ingredients, when added in an amount over 0.006 mass %, the pressed shape and the bonding strength deteriorate. Further, the effect of addition of indium is obtained with 0.0003 mass % or more. Further, with 0.0002 mass % or less, industrial control of the ingredients becomes difficult.

Rare earth elements other than praseodymium, calcium, lanthanum, cerium, neodymium, europium, and samarium also improve the strength, but the effects are smaller compared with the above elements, so they run counter to the objective of the present invention of lowering the amount of additive elements and raising the strength.

When desiring to increase the strength by the same amount of addition, it is preferable to make the rare earth elements other than praseodymium, calcium, lanthanum, cerium, neodymium, europium, and samarium 0.0005 mass % or less and increase the amounts of the above seven elements.

In particular, addition of praseodymium is preferable, but if formation of precipitates is unavoidable due to the limitations on the production conditions, it is preferable to use calcium, lanthanum, cerium, neodymium, europium, and samarium to supplement the strength.

Among the elements other than the rare earth elements, Japanese Patent No. 2773202 describes that silicon suppresses the drop in strength at the time of bonding, but silicon easily heavily precipitates at the crystal grain boundaries, aids grain boundary breakage, and lowers strength, so the amount is preferably made 0.0014 mass % or less.

Further, lead, similarly, is preferably added in an amount of 0.0014 mass % or less. Lithium, sodium, and other alkali metals sometimes cause corrosion or other damage on other mounting materials after mounting, so the amounts are preferably made 0.0014 mass % or less.

The silicon, lead, and alkali metals easily enter into the gold material or additive element material as impurities. If calling these unavoidable impurities, these elements have to be controlled to the above amounts of impurities or less from the viewpoint of suppressing these problems.

The addition of elements not prescribed in the present invention is not particularly limited, but in general, gold wire or the ball surface easily oxidize at the time of bonding, so avoiding addition as much as possible is preferable.

However, precious metals such as palladium, platinum, rhodium, ruthenium, osmium, iridium, copper, and silver do not promote oxidation of gold wire that much, so certain amounts may be contained.

For example, if 0.001 mass % or less, there is not much effect on the bondability. If added in a range of 0.001 mass % to 2 mass %, growth of the intermetallic compounds with the aluminum electrode or formation of voids is suppressed in a high temperature environment of use of 100 to 250° C. after bonding, so the effect is obtained of increasing the high temperature reliability.

Further, the high strength to be realized by the present invention is not obtained by just additive elements. The strength to be obtained by the present invention is obtained by addition of said dopant, working hardening by work by a work rate of 98% or more, and formation of a worked structure.

The "work rate" referred to here is the value calculated by $(A_0-A_1)/A_0 \times 100(\%)$ when the cross-sectional area in the cast state or at the time of process annealing is $A_0$ and the final wire size is $A_1$.

"Process annealing" is heat treatment for recrystallization performed in the middle of the drawing process. The process annealing is performed in the rod or wire state in some cases, but in the present invention, intermediate materials are also broadly referred to as "ingots".

Process annealing differs from the minor stress relief annealing performed in the final process. In practice, an ingot heat treated at 300° C. or more is drawn by a cross-sectional reduction rate of 98% or more and 0.0004 mass % or more of praseodymium is added so as to form strong work hardening and a <111> structure and thereby realize a high strength.

Usually, finally, stress relief annealing is performed to reduce the drawing and winding defects called "curls" and increase the straightness of the wire to thereby obtain the final product. The wire is used in the state with the strength dropped from the strength in the drawn state. The present invention is particularly utilized to obtain a product with a breakage strength of 210 MPa or more.

Even when not using praseodymium as an essential element, with a set breakage strength of less than 210 MPa, a good bondability can be obtained.

EXAMPLES

Below, examples are used to explain the present invention in detail, but these show preferable examples of the present invention. The present invention is not limited in any way by these examples.

Example 1

Bonding wire gold materials comprised of 99.9998 mass % of gold plus 0.0002 mass % to 0.03 mass % of praseodymium, calcium, lanthanum, cerium, neodymium, samarium, europium, thulium, ytterbium, and yttrium were compared for strength per amount of addition of these elements and ease of single phase formation.

The above elements were added in amounts of 0.0002 to 0.03 mass % to a gold material of a purity of 99.9998 mass % or more and the results cast into ingots of a diameter of 5 mm and length of 100 mm. These were cooled in a cooling furnace by an average cooling rate from 1200 to 900° C. of about 80° C./minute. Among casting furnaces not using forced cooling, the cooling furnace is the one with relatively large cooling rates.

After casting, the ingredients were analyzed and it was confirmed that silicon, lead, lithium, and sodium were contained in amounts of 0.0014 mass % or less and calcium and rare earth elements other than the additive elements in amounts of 0.0002 mass % or less.

Next, part of each ingot was sampled as a sample for examination of the structure. The remaining material was rolled using a groove rolling mill to about 2 mm square, then drawn to 23 μm by drawing using a diamond die. The reduction in area each time per passage through the die in the drawing process was about 10%. Note that the reduction in cross-sectional area from this cast state was 98% or more.

After to this, a tube furnace was used for continuous heat treatment in argon, the elongation at break was adjusted to 4.5%, and the tensile breakage strength was measured.

The reason for making the elongation at break 4.5% is that normally bonding wire is heat treated after drawing to secure straightness and is controlled in elongation at break to 2 to 8%, usually 3 to 6%. The intermediate was used. The strength of the gold material when adjusting the elongation at break to 4.5% was 90 MPa.

When adding an additive element alone, for each element, if increasing the amount of addition, the strength monotonously increased. The increase in strength per 0.0001 mass % of additive element in the range of 0.0004 to 0.01 mass % obtained by subtracting the strength of the gold material from the strength of the produced gold wire is shown in Table 1.

The rise in strength per additive element is gentle, but corresponds to that in the case of adding about 0.003 mass %.

TABLE 1

Increase in Tensile Breakage Strength Per Mass of Additive
Elements With Respect to Pure Gold (MPa/mass ppm)

| Pr  | Ca  | La  | Ce  | Nd  | Sm  | Eu  | Tm  | Yb  | Y   |
|-----|-----|-----|-----|-----|-----|-----|-----|-----|-----|
| 4.3 | 4.1 | 2.7 | 3.7 | 3.5 | 3.3 | 3.4 | 0.1 | 1.0 | 1.1 |

As will be understood from Table 1, the increase in strength per 0.0001 mass % was largest with praseodymium. The next largest effects were with calcium, lanthanum, cerium, neodymium, europium, and samarium.

Calcium exhibited a larger value comparable with praseodymium. For calcium, compared with praseodymium, with the same mass concentration, an approximately 3.15 times greater atomic concentration was required. Therefore, the efficiency of addition per atomic concentration was higher with praseodymium.

Next, a cross-section of each cast ingot was polished and examined for structure by an optical microscope. As a result, secondary phases were observed due to the amount of addition in ingots containing praseodymium, lanthanum, and europium. EPMA and Auger analysis showed that the secondary phases were comprised of precipitates formed by gold and the additive ingredient elements.

The concentration of the additive ingredient of the precipitates was 10 to 40 atomic % or an extremely high concentration compared with the matrix. The precipitates were not formed when the concentrations of the additive elements were small, but were formed when the concentrations rose. The concentration at which precipitates were formed differed with each element. With praseodymium, it was 0.0041 mass %, with lanthanum 0.0009 mass %, and with europium 0.0021 mass %.

These elements were elements with a great contribution to strength, but praseodymium had the greatest contribution to strength. Further, among the three additive elements, it could be said to be the element most resistant to formation of secondary phases.

Secondary phases of a size able to be observed by an optical microscope have a good chance of causing breakage at the time of production or defects at the time of bonding when gold wire is made thinner. The secondary phases are precipitates not dissolving in the gold during solidification and cooling.

From the above experimental results, it was learned that the effect of addition per concentration of addition with respect to the strength of the gold wire was highest with praseodymium followed by calcium and then further by cerium, neodymium, europium, samarium, and lanthanum.

Therefore, by using praseodymium as an additive element, a high strength was obtained by a lower amount of addition than with use of other elements. However, it was learned that praseodymium was desirably 0.004 mass % or less when using a normal melting and casting furnace to obtain a single phase.

Example 2

Next, the inventors added praseodymium to the gold wire and investigated the effect of composite addition adding calcium, cerium, neodymium, europium, samarium, lanthanum, thulium, ytterbium, and yttrium.

The method of production of gold wire was the same as in Example 1, but the final wire size was made 20 μm. The value of the set elongation at break at the final annealing process was made 4.5% the same as Example 1. Further, the inventors sampled the end of each ingot before drawing and investigated the amount of precipitation of the secondary phases at the ingot cross-section.

The secondary phases were evaluated by examining the polished surface of a cross-section of the ingot by a 1000× optical microscope at any 50 non-overlapping fields of 85.6× 61.2 μm (0.262 mm$^2$) and counting the number of precipitates. Precipitates of a diameter of about 0.5 μm or more could be counted.

Table 2 shows the results of investigation of the analyzed ingredients, strength, and amount of formation of precipitates in the ingots.

TABLE 2

Analyzed Ingredients (mass ppm), Strength, and Amount of
Formation of Precipitates in Ingots of Gold Wire Fabricated by
Example 2

| No. | Pr | Ca | Ce | Nd | Eu | Sm | La | Tm | Yb | Y | Au | Strength (MPa) | Secondary phase density (/mm$^2$) | Remarks |
|-----|----|----|----|----|----|----|----|----|----|----|------|------|------|---------|
| 1 | 10 |  |  |  |  |  |  |  |  |  | Bal. | 210 | 0 | Inv. ex. |
| 2 | 4 | 6 |  |  |  |  |  |  |  |  | Bal. | 212 | 0 | Inv. ex. |
| 3 | 4 |  | 6 |  |  |  |  |  |  |  | Bal. | 210 | 0 | Inv. ex. |
| 4 | 4 |  |  |  |  |  |  |  |  | 7 | Bal. | 182 | 0 | Inv. ex. |
| 5 |  | 10 |  |  |  |  |  |  |  |  | Bal. | 202 | 0 | Comp. ex. |
| 6 | 20 |  |  |  |  |  |  |  |  |  | Bal. | 225 | 0 | Inv. ex. |
| 7 | 6 | 7 |  | 7 |  |  |  |  |  |  | Bal. | 230 | 0 | Inv. ex. |
| 8 | 6 |  | 8 |  | 3 | 3 |  |  |  |  | Bal. | 219 | 0 | Inv. ex. |
| 9 | 4 | 6 |  | 10 |  |  |  |  |  |  | Bal. | 235 | 0 | Inv. ex. |
| 10 |  | 6 |  | 11 | 4 |  |  |  |  |  | Bal. | 209 | 0 | Comp. ex. |
| 11 | 40 | 10 |  |  |  |  |  |  |  |  | Bal. | 290 | 0 | Inv. ex. |
| 12 | 42 | 5 |  | 3 |  |  |  |  |  |  | Bal. | 291 | 11 | Inv. ex. |
| 13 | 15 | 25 |  | 10 |  |  |  |  |  |  | Bal. | 300 | 0 | Inv. ex. |
| 14 | 14 | 25 |  |  |  |  | 10 |  |  |  | Bal. | 291 | 38 | Inv. ex. |
| 15 | 15 | 24 |  |  |  |  |  |  | 8 |  | Bal. | 293 | 0 | Inv. ex. |
| 16 | 10 | 26 |  | 30 |  |  |  |  |  |  | Bal. | 310 | 0 | Inv. ex. |
| 17 | 8 | 25 | 15 | 10 |  |  |  |  |  |  | Bal. | 280 | 0 | Inv. ex. |
| 18 | 9 | 30 |  | 20 |  |  |  |  |  |  | Bal. | 291 | 0 | Inv. ex. |
| 19 | 8 | 25 |  | 10 | 10 |  |  |  |  |  | Bal. | 281 | 0 | Inv. ex. |

TABLE 2-continued

Analyzed Ingredients (mass ppm), Strength, and Amount of Formation of Precipitates in Ingots of Gold Wire Fabricated by Example 2

| No. | Pr | Ca | Ce | Nd | Eu | Sm | La | Tm | Yb | Y | Au | Strength (MPa) | Secondary phase density (/mm$^2$) | Remarks |
|---|---|---|---|---|---|---|---|---|---|---|---|---|---|---|
| 20 | 7 | 26 |  | 20 |  |  |  |  |  |  | Bal. | 280 | 0 | Inv. ex. |
| 21 | 8 | 20 | 5 | 22 |  |  |  |  |  |  | Bal. | 281 | 45 | Inv. ex. |
| 22 | 8 | 25 |  |  |  |  |  |  |  | 22 | Bal. | 270 | 0 | Inv. ex. |
| 23 |  | 30 |  |  |  |  |  |  | 80 |  | Bal. | 265 | 0 | Comp. ex. |
| 24 |  | 31 |  |  |  |  |  | 80 |  |  | Bal. | 264 | 0 | Comp. ex. |

As shown in Example 1, the effect on the strength per unit element by each element alone was highest with praseodymium. As shown in Table 2, when adding calcium, cerium, neodymium, europium, samarium, and lanthanum in addition to praseodymium, effects equal to or greater than that of the case of addition of praseodymium alone were obtained.

On the other hand, thulium, ytterbium, and yttrium had small effects on strength even when added compositely. In particular, when not adding praseodymium, large amounts of addition were necessary for raising the strength.

Therefore, it was learned that by first using praseodymium and secondarily using calcium, cerium, neodymium, europium, samarium, and lanthanum, gold wire securing bondability and high in strength could be obtained even with low amounts of addition.

Further, the amounts of addition where precipitates were formed when adding praseodymium, lanthanum, and europium were substantially the same as with the case of addition alone.

Example 3

Next, the inventors investigated the effects on the bonding properties when adding beryllium and aluminum to gold wire of the ingredients of the present invention. The method of production of the gold wire other than the ingredients was the same as in Example 1.

The bonding test was performed using UTC-400 made by Arakawa Corporation. Further, the capillary used was a T0-11-9SA made by Toto-Kiki Corporation. Silicon chips of a height of 480 μm to 42 Alloy lead frames were connected by the above bonding wire.

The gold wire was used for first bonding on an Al—Cu electrode at the silicon chip side and wedge bonding (second bonding) on a silver plated electrode on the 42 Alloy side. The pitch between pads of the first bonding of the ball bonding was 60 μm. A 60 μm pad pitch is the general pad pitch currently industrially used. The wire span was about 5 mm and the loop height from the pad was 90 μm. The bonding was performed in the atmosphere and the bonding temperature was made 150° C.

First, the inventors investigated if bonding was possible with gold wire to which praseodymium, calcium, lanthanum, cerium, neodymium, europium, samarium, thulium, and ytterbium had been added alone without causing contact between pressed balls (short-circuits) or peeling at the time of bonding (bonding failure).

The inventors performed the bonding while adjusting the ultrasonic wave amplitude, load, and bonding speed at the time of bonding.

As a result of the test, the phenomenon arose that when a certain solute concentration was reached, the ball and pad electrode failed to be bonded and ended up separating in about one bond per 200. The concentration at the limit where this bonding failure occurred was 0.020 mass % in the case of praseodymium, calcium, lanthanum, cerium, neodymium, europium, samarium, thulium, and ytterbium.

On the other hand, the concentration for yttrium was 0.015 mass %. Yttrium has a smaller mass number compared with other rare earth elements. Even with the same amount of addition, if viewed by the atomic ratio, the amount of addition became larger and oxidation became severer.

Calcium similarly has a small mass number, but bonding was possible up to the same extent as with a rare earth element. This was because it was chemically resistant to oxidation compared with a rare earth element.

Further, with gold wire containing praseodymium, calcium, lanthanum, cerium, neodymium, europium, samarium, thulium, or ytterbium alone, if adding 0.015 mass % or more, short-circuits occurred where ball pressed parts ended up contacting each other between pressed balls.

If observing the pressed balls, complete circularity was not achieved. The pressed balls greatly stretched in the direction of application of the ultrasonic wave at the time of bonding resulting in petal shaped irregularities and short-circuits at flat parts. If reducing the ultrasonic wave amplitude or load so that this did not occur, bonding failure ends up occurring.

Next, the inventors ran bonding tests adding beryllium and aluminum to the system containing praseodymium.

If adding praseodymium, calcium, lanthanum, cerium, neodymium, europium, samarium, thulium, and ytterbium alone in an amount of 0.015 mass % or more, short-circuits sometime occurred between pressed balls. If reducing the first bonding load of the first bonding to prevent this, bonding failure ended up occurring. With gold wire to which beryllium or aluminum was added in an amount of 0.0002 mass %, bonding was possible without short-circuits up to an amount of addition of praseodymium of 0.02 mass %.

This was because the addition of beryllium and aluminum caused a smaller pressed size of the ball and further improved the circularity.

When compared by gold wire with the same amount of addition of praseodymium, if adding beryllium in an amount of 0.0005 mass % or aluminum in an amount of 0.001 mass %, the shear strength of the first bonding increased 10% even with the smallest effect.

From the above, it was learned that addition of beryllium or aluminum had the action of increasing the circularity of the pressed balls, reducing the pressed size, and increasing the bonding strength and improving the first bondability.

However, with gold wire to which beryllium was added in an amount of 0.0010 mass % or more, the second bondability deteriorated. The second bonding conditions were fixed to a bonding speed (search speed), ultrasonic wave strength, and bonding time of 3.0 μm/ms, 40 (unit distinctive to bonders), and 15 ms. The bonding load was changed.

In gold wire having 0.0009 mass % of beryllium added, a range of load enabling bonding was observed, but in gold wire having 0.0010 mass % or more added, if the load became too light, bonding failure occurred, while if increasing the load, the gold wire ended up breaking at the time of second bonding and bonding was not possible.

On the other hand, with aluminum up to 0.005 mass %, it was possible to find conditions enabling bonding by the same method of evaluation as a system to which beryllium had been added.

Example 4

Various types of additive elements were combined to produce bonding wire comprised of medium strength gold wire having an elongation at break of 4.5% and a tensile strength of 240 MPa or so. At the present, this is the gold wire of the most universally used level of strength. The method of production and the final wire size were the same as in Example 1.

Table 3 shows the values of the ingredients (analysis values), the strength at the time of an elongation at break of 3%, 4.5%, and 6%, and the formation of any precipitates. Further, Table 3 shows the bonding properties evaluated using bonding wire prepared by adjusting the elongation at break to 4.5%.

The tensile strength becomes smaller the larger the set elongation. This is because the temperature in the final heat treatment process is high and recovery and recrystallization proceed. Usually, the set elongation of a bonding wire, while depending on the application, is 3 to 8%.

The precipitates were evaluated in the same way as Example 2 by viewing the polished surface of a cross-section of an ingot using a 1000× optical microscope, observing any 50 non-overlapping fields of 85.6×61.2 μm (0.262 mm$^2$), counting the number of precipitates, and converting it to a density per 1 mm$^2$. Precipitates of a diameter of about 0.5 μm or more could be counted.

A bonding test was run using a chip with a pad pitch of 50 μm and a pad material of Al-1% Cu. The bonding was performed using a K&S made 8028pps, setting the pressed size of the first bonding to 40 μm, and with a loop length of 1.5 mm. The bonding was performed in the atmosphere with a chip surface temperature of 150° C.

The bonding properties were evaluated by measuring the shear strength and pressed ball defect rate as the first bondability.

As the criteria for defective pressed balls, the pressed sizes in a direction of application of the ultrasonic waves in the first bonding and the direction perpendicular to it were measured. Balls with a value of the pressed size in the direction perpendicular to application of the ultrasonic waves divided by the pressed size in the direction of application of the ultrasonic waves of over 1.1 and balls with recessed shapes in the pressed circumferences were judged as defective balls. The number divided by the number observed was defined as the ball defect rate.

In the present invention, when the ball defect rate was 20% or less, the bondability was deemed to be particularly good. Further, as an indicator of the first bondability, when the bonding strength after bonding was 98 mN or more, the bondability was deemed to be particularly good.

The second bondability was evaluated by the values at a bonding speed where second bonding failure (stitchoff) occurred when fixing the bonding load, ultrasonic strength, and bonding time to 196 mN, 600 mW, and 15 ms.

In the case of the evaluated bonder, the speed of the tip of the tool (capillary) at the time of bonding (μm/ms) was called the "C/V value". The better the second bondability of the gold wire, the lower the value, that is, bonding by a low impact became possible. In the present invention, when the C/V value was 5.0 or less and bonding becomes possible, the second bondability was deemed to be particularly good.

TABLE 3

Properties of Gold Wire Designed With Strength of 240 MPA With Elongation at Break of 4.5%

| | Amount added (mass ppm) | | | | | | | | | | | | Tensile strength (MPa) | | | | First bondability | | Second bondability | |
|---|---|---|---|---|---|---|---|---|---|---|---|---|---|---|---|---|---|---|---|---|
| | | | | | | | | | | | | | Set elongation 3% | Set elongation 4.5% | Set elongation 6% | Precipitate density | Shear strength | Ball defect rate | Limit C/V value | |
| No. | Pr | Ca | La | Ce | Nd | Eu | Sm | Tm | Yb | Y | Be | Al | Au | | | | (/mm$^2$) | (mN) | (%) | (μm/ms) | Remarks |
| 25 | 36 | | | | | | | | | | | | Bal. | 312 | 240 | 227 | 0 | 106 | 19 | 3.4 | Inv. ex. |
| 26 | 36 | | | | | | | | | | | 2 | Bal. | 315 | 243 | 228 | 0 | 110.8 | 12 | 3.5 | Inv. ex. |
| 27 | 36 | | | | | | | | | | | 9 | Bal. | 330 | 253 | 235 | 0 | 118.7 | <1 | 4.8 | Inv. ex. |
| 28 | 35 | | | | | | | | | | 10 | | Bal. | 333 | 255 | 236 | 0 | 117.7 | <1 | 5.1 | Inv. ex. |
| 29 | 34 | | | | | | | | | | 5 | 8 | Bal. | 335 | 255 | 236 | 0 | 119.6 | <1 | 3.6 | Inv. ex. |
| 30 | 35 | | | | | | | | | | | 10 | Bal. | 332 | 254 | 235 | 0 | 118.7 | 2 | 3.7 | Inv. ex. |
| 31 | 36 | | | | | | | | | | | 40 | Bal. | 320 | 245 | 228 | 0 | 111.8 | <1 | 3.8 | Inv. ex. |
| 32 | 35 | | | | | | | | | | 10 | | Bal. | 340 | 260 | 236 | 0 | 109.8 | 3 | 5.5 | Inv. ex. |
| 33 | 10 | 15 | | 10 | | | | | | | | 8 | Bal. | 335 | 256 | 236 | 0 | 109.8 | 3 | 3.5 | Inv. ex. |
| 34 | 9 | 25 | | | | | | | | | 3 | 8 | Bal. | 340 | 253 | 230 | 0 | 117.7 | <1 | 3.5 | Inv. ex. |
| 35 | 10 | | | | | | | | | 60 | | 8 | Bal. | 313 | 241 | 226 | 0 | 74.5 | 25 | 4.4 | Inv. ex. |
| 36 | 11 | | | | | 28 | | | | | 3 | 8 | Bal. | 318 | 235 | 225 | 0 | 107.9 | 2 | 4.4 | Inv. ex. |
| 37 | 10 | 9 | 4 | 5 | 8 | | | | | | 3 | 9 | Bal. | 312 | 243 | 226 | 0 | 113.7 | <1 | 4.0 | Inv. ex. |
| 38 | 9 | 8 | 5 | 4 | 8 | | 5 | | | | 4 | 9 | Bal. | 316 | 245 | 228 | 0 | 118.7 | <1 | 4.0 | Inv. ex. |
| 39 | 8 | 13 | | | 19 | | | | | | | 10 | Bal. | 309 | 239 | 226 | 0 | 106.9 | <1 | 3.5 | Inv. ex. |

TABLE 3-continued

Properties of Gold Wire Designed With Strength of 240 MPA With Elongation at Break of 4.5%

| | Amount added (mass ppm) | | | | | | | | | | | | | Tensile strength (MPa) | | | | First bondability | | Second bondability | |
|---|---|---|---|---|---|---|---|---|---|---|---|---|---|---|---|---|---|---|---|---|---|
| | | | | | | | | | | | | | | Set elongation | Set elongation | Set elongation | Precipitate density | Shear strength | Ball defect rate | Limit C/V value | |
| No. | Pr | Ca | La | Ce | Nd | Eu | Sm | Tm | Yb | Y | Be | Al | Au | 3% | 4.5% | 6% | (/mm²) | (mN) | (%) | (μm/ms) | Remarks |
| 40 | 10 | 10 | | | 16 | | | | | | | 7 | Bal. | 311 | 241 | 219 | 0 | 108.8 | 1 | 3.8 | Inv. ex. |
| 41 | 11 | 12 | 16 | | | | | | | | | 5 | Bal. | 309 | 240 | 219 | 217 | 89.2 | 26 | 4.9 | Inv. ex. |
| 42 | 5 | | | | 25 | | | | | | 4 | | Bal. | 313 | 241 | 219 | 80 | 93.2 | 22 | 5.2 | Inv. ex. |
| 43 | 5 | 10 | | 14 | | | | | | | 2 | | Bal. | 312 | 243 | 227 | 0 | 111.0 | 5 | 3.4 | Inv. ex. |
| 44 | 5 | 7 | | 8 | | | | | | | | 30 | Bal. | 305 | 239 | 218 | 0 | 103.0 | 8 | 3.6 | Inv. ex. |
| 45 | 4 | 8 | | 9 | | | | | | 8 | | | Bal. | 315 | 241 | 219 | 0 | 112.8 | 6 | 4.5 | Inv. ex. |
| 46 | 6 | 7 | | 9 | | | | | | 5 | 10 | | Bal. | 312 | 245 | 222 | 0 | 112.8 | <1 | 3.8 | Inv. ex. |
| 47 | 6 | 9 | | | | | | | | 7 | 9 | | Bal. | 308 | 242 | 229 | 0 | 119.6 | <1 | 3.9 | Inv. ex. |
| 48 | 5 | | 7 | 5 | 5 | | | | | | | 10 | Bal. | 305 | 238 | 219 | 0 | 110.8 | 2 | 3.6 | Inv. ex. |
| 49 | 2 | 7 | | | | | | | 70 | | | | Bal. | 280 | 237 | 205 | 0 | 67.7 | 15 | 3.8 | Comp. ex. |
| 50 | | 8 | | | | | | 58 | | | 5 | | Bal. | 285 | 235 | 207 | 0 | 69.6 | 17 | 3.9 | Comp. ex. |
| 51 | | 7 | | | | | | | | 60 | | 2 | Bal. | 290 | 237 | 207 | 0 | 84.3 | 11 | 4.4 | Comp. ex. |

In the case of praseodymium alone, by addition of 0.0036 mass % or more, a breakage strength of 240 MPa was obtained. Further, formation of precipitates could not be observed. Even with praseodymium alone, relatively good bonding became possible, but by adding beryllium or aluminum, in particular the first shear strength increased and the circularity of the pressed size was improved.

In particular, the effect of beryllium was large. However, with wire in which beryllium was added in an amount of 0.0010 mass %, the second bondability deteriorated.

When adding aluminum, deterioration of the second bondability could not be observed. Due to the combination of aluminum and beryllium, a bonding property balanced in first and second bondabilities was obtained.

When reducing the amount of addition of praseodymium more than this, the breakage strength when the set elongation was 4.5 mass % exceeded 240 MPa, so addition of calcium or another rare earth element became necessary.

By use alone, composite addition of calcium and rare earth element gave a high strength by a low amount of addition. In particular, the combination of praseodymium, calcium, and neodymium was good.

On the other hand, when using thulium, ytterbium, and yttrium not covered by the present invention, large amounts of addition became necessary. As a result, the shear strength, pressed shape, and other aspects of the first bondability deteriorated.

Further, in gold wire to which lanthanum and europium were been added in the prescribed amounts of the present invention or more, formation of precipitates in the gold wire was observed. Almost all of the precipitates were granular, but the precipitates had some ductility. These were stretched in the longitudinal direction of the gold wire by the drawing operation resulting in ones of a size in the radial direction of the wire of 1 μm and a size in the longitudinal direction of about 10 μm.

In this gold wire, compared with other gold wire containing different types of rare earth elements, the bondability was somewhat poor or the loop shape was not stable.

When adding a rare earth to the praseodymium for composite addition, addition of beryllium and aluminum increased the circularity of the ball and further increased the shear strength and improved the first bondability. Aluminum did not have as great an effect per amount of addition as beryllium, but no deterioration of the second bondability was recognized.

By combining aluminum and beryllium, balanced bondability properties of the first and second bondabilities could be obtained. In particular, good effects could be obtained with beryllium in an amount of 0.0009 mass % or less.

Further, when observing the neck damage arising right above the ball, the neck damage to the gold wire in the two types to which neodymium was added in an amount of 0.001 mass % or more was a small one of several defects.

Example 5

Various types of additive elements were combined to produce bonding wire comprised of high strength gold wire having an elongation at break of 4.5% and a tensile strength of 280 MPa or so. The materials, method of production, and final wire size were the same as in Examples 1 and 2.

Table 4 shows the ingredients (analyzed values), strengths at elongations at break of 3%, 4.5%, and 6%, formation of precipitates, and bonding properties. The bonding properties were tested using bonding wire adjusted to an elongation at break of 4.5%. The precipitates and bonding properties were evaluated in the same way as in Example 4. Further, the bonding conditions were the same as in Example 4, The results are shown in Table 4.

TABLE 4

Properties of Gold Wire Designed With Strength of 280 MPA With Elongation at Break of 4.5%

| | Amount added (mass ppm) | | | | | | | | | | | | | Tensile strength (MPa) | | | Precipitate density ($/mm^2$) | First bondability | | Second bondability Limit C/V value (μm/ms) | Remarks |
|---|---|---|---|---|---|---|---|---|---|---|---|---|---|---|---|---|---|---|---|---|---|
| | | | | | | | | | | | | | | Set elongation 3% | Set elongation 4.5% | Set elongation 6% | | Shear strength (mN) | Ball defect rate (%) | | |
| No. | Pr | Ca | La | Ce | Nd | Eu | Sm | Tm | Yb | Y | Be | Al | Au | | | | | | | | |
| 52 | 43 | | | | | | | | | | | | Bal. | 370 | 279 | 239 | 15 | 103.0 | 22 | 3.9 | Inv. ex. |
| 53 | 43 | | | | | | | | | | | 4 | Bal. | 374 | 281 | 239 | 15 | 106.9 | 15 | 3.9 | Inv. ex. |
| 54 | | 48 | | | | | | | | | | 3 | Bal. | 362 | 288 | 240 | 0 | 101.0 | 29 | 4.2 | Inv. ex. |
| 55 | 39 | | | | | | | | | | 4 | 9 | Bal. | 385 | 281 | 240 | 0 | 116.7 | 4 | 4.2 | Inv. ex. |
| 56 | 37 | 6 | | | | | | | | | 2 | 10 | Bal. | 390 | 285 | 242 | 0 | 117.7 | 5 | 3.8 | Inv. ex. |
| 57 | 20 | 20 | | | 5 | | | | | | | | Bal. | 361 | 280 | 241 | 0 | 97.1 | 22 | 3.4 | Inv. ex. |
| 58 | 21 | 19 | | | 6 | | | | | | | 8 | Bal. | 365 | 282 | 242 | 0 | 109.8 | 3 | 3.4 | Inv. ex. |
| 59 | 19 | 20 | | | 4 | | | | | | 4 | 8 | Bal. | 375 | 288 | 245 | 0 | 118.7 | <1 | 3.9 | Inv. ex. |
| 60 | 19 | 20 | | | 6 | | | | | | 9 | | Bal. | 381 | 286 | 243 | 0 | 117.0 | 3 | 4.5 | Inv. ex. |
| 61 | 19 | 21 | | | 5 | | | | | | | 10 | Bal. | 380 | 285 | 243 | 0 | 116.7 | 3 | 5.1 | Inv. ex. |
| 62 | 20 | 11 | | 12 | | | | | | | 5 | 5 | Bal. | 385 | 285 | 245 | 0 | 117.7 | <1 | 4.1 | Inv. ex. |
| 63 | 20 | 10 | 9 | | 5 | | | | | | | | Bal. | 369 | 279 | 240 | 91 | 96.1 | 31 | 4.1 | Inv. ex. |
| 64 | 16 | 29 | | 17 | | | | | | | 4 | 8 | Bal. | 378 | 285 | 244 | 0 | 119.6 | 5 | 4.2 | Inv. ex. |
| 65 | 15 | 30 | | 15 | | | | | | | 8 | | Bal. | 378 | 295 | 245 | 0 | 117.7 | 3 | 4.5 | Inv. ex. |
| 66 | 14 | 25 | 5 | 5 | | | | | | | 5 | 5 | Bal. | 380 | 295 | 244 | 0 | 118.7 | <1 | 4.0 | Inv. ex. |
| 67 | 15 | 30 | | | 9 | 10 | | | | | 5 | 9 | Bal. | 395 | 305 | 247 | 0 | 116.7 | 2 | 4.2 | Inv. ex. |
| 68 | 14 | 31 | | | 10 | 9 | | | | | | | Bal. | 390 | 303 | 247 | 0 | 106.9 | 38 | 4.1 | Inv. ex. |
| 69 | 10 | 29 | 5 | 5 | 4 | | | | | | 4 | 8 | Bal. | 396 | 304 | 242 | 0 | 107.9 | 3 | 4.2 | Inv. ex. |
| 70 | 11 | 35 | | | | | 25 | | | | 4 | 10 | Bal. | 389 | 301 | 242 | 0 | 99.0 | 19 | 4.5 | Inv. ex. |
| 71 | 11 | 30 | | | | | 35 | | | | 5 | 9 | Bal. | 387 | 300 | 241 | 0 | 63.7 | 52 | 4.8 | Inv. ex. |
| 72 | 11 | 31 | | | 33 | | | | | | 4 | 10 | Bal. | 390 | 301 | 242 | 0 | 108.8 | 11 | 4.5 | Inv. ex. |
| 73 | 11 | 30 | | | 34 | | | | | | 3 | 8 | Bal. | 387 | 301 | 242 | 0 | 87.3 | 29 | 4.8 | Inv. ex. |
| 74 | 10 | 31 | | | | | | 32 | 29 | 25 | 3 | 6 | Bal. | 384 | 302 | 242 | 0 | 66.7 | 78 | 4.9 | Inv. ex. |
| 75 | | 35 | 20 | | 35 | | | | | | 4 | 7 | Bal. | 389 | 301 | 242 | 110 | 61.8 | 45 | 4.5 | Comp. ex. |
| 76 | | 40 | | 7 | | | | | | | 5 | 9 | Bal. | 387 | 300 | 241 | 0 | 63.7 | 52 | 4.9 | Comp. ex. |
| 77 | 6 | 33 | | | 30 | | | | | | 3 | 7 | Bal. | 386 | 300 | 240 | 0 | 105.3 | 14 | 4.6 | Inv. ex. |

In the case of praseodymium alone, with addition of 0.0043 mass %, a breakage strength of 279 MPa was obtained. Some precipitate formation was observed, but no effect on the bonding properties could be observed. Further, calcium also gave a strength over 280 MPa with addition of 0.0048 mass %. Here too, formation of precipitates could not be observed.

However, if comparing the bonding characteristics, in a material containing calcium alone, the probability of ball defects was large. In the case of praseodymium, 0.0043 mass % was added for 0.0060 atomic %, while in the case of calcium, 0.0048 mass % was added for addition of 0.0236 atomic %.

In the latter case, an easily oxidizable metal was added in a high concentration, so probably oxidation was severe at the time of formation of the molten ball at the time of bonding and sound bonding was not possible.

When adding several of calcium, lanthanum, neodymium, europium, and samarium in addition to praseodymium, good results were obtained. In particular, the bondability was better than when adding the elements alone.

In high strength gold wire, in particular, to achieve both strength and bondability, it is necessary to add a suitable amount of beryllium or aluminum. However, from the viewpoint of the second bondability, the amount of beryllium was preferably made 0.0009 mass % or less.

It was possible to produce gold with a strength at the time of an elongation at break of 4.5% over 300 MPa without praseodymium, but achievement with bondability was difficult. In particular, when using a rare earth element other than praseodymium alone and the amount of addition exceeded 0.003 mass %, the bondability deteriorated.

By adding praseodymium, it was learned that less addition of other elements was enough and that high strength gold wire superior in bondability could be produced.

Further, when observing the neck damage occurring right above the ball, the neck damage at the eight types of gold wire containing neodymium in amounts of 0.001 mass % or more was a small one of several defects. The results were particularly superior with the seven types of gold wire in which praseodymium was compositely added.

Example 6

99.9998 mass % of gold and bonding wire gold materials comprised of this plus 0.002 mass % to 0.02 mass % of praseodymium, calcium, lanthanum, cerium, neodymium, samarium, europium, thulium, ytterbium, and yttrium were compared for strength per amount of addition and single phase formation.

Unlike Example 1, the ingots were produced by using as the melting point the zone melting method—one type of one-directional solidification method.

The above elements were added in amounts of 0.002 mass % to 0.02 mass % to a gold material of a purity of 99.9998 mass % or more and the results cast into ingots of diameters of 10 mm and lengths of 150 mm. The cooling was performed by natural cooling and the average cooling rate from 1100 to 500° C. was about 50° C. per minute.

After casting, the ingredients were analyzed and it was confirmed that silicon, lead, lithium, and sodium were present in amounts of 0.0014 mass % or less and the calcium and rare earth element other than the additive elements were present in 0.0002 mass % or less.

Each cast ingot was rolled using a groove rolling mill to about 6 mm square, then reduced to 4 mm by drawing using a diamond die, then annealed at 400° C. for 30 minutes, then again drawn to 18 μm. The rate of reduction of area from the size of the annealed wire to the final wire size was 98% or more.

The reduction in area each time per passage through the die in the drawing process was about 10%. Breakage occurred in some of the compositions. For the breakage, the number of breaks until drawing the entire ingot to the final wire size was counted.

After this, a cross-section of the wire was polished and the density of precipitates of a long size of 0.5 μm or more was measured. The results are shown together with the number of wire breaks in Table 5.

TABLE 5

Elements Contained in Two-Way Gold Wire Produced in Example 6, Precipitate Density Per mm² With Respect to Amount (Top Row) and Number of Wire Breaks (Bottom Row)

| Additive element | Amount added (mass ppm) | | | | | |
|---|---|---|---|---|---|---|
|  | 20 | 30 | 35 | 50 | 100 | 200 |
| Pr | 0/mm² | 0/mm² | 0/mm² | 0/mm² | 0/mm² | 9/mm² |
|  | 0 time | 0 time | 0 time | 0 time | 0 time | 0 time |
| Ca | 0/mm² | 0/mm² | 0/mm² | 0/mm² | 0/mm² | 0/mm² |
|  | 0 time | 0 time | 0 time | 0 time | 0 time | 0 time |
| Co | 0/mm² | 0/mm² | 0/mm² | 0/mm² | 0/mm² | 0/mm² |
|  | 0 time | 0 time | 0 time | 0 time | 0 time | 0 time |
| Nd | 0/mm² | 0/mm² | 0/mm² | 0/mm² | 0/mm² | 8/mm² |
|  | 0 time | 0 time | 0 time | 0 time | 0 time | 0 time |
| Sm | 0/mm² | 0/mm² | 0/mm² | 0/mm² | 0/mm² | 0/mm² |
|  | 0 time | 0 time | 0 time | 0 time | 0 time | 0 time |
| La | 0/mm² | 9/mm² | 10/mm² | 47/mm² | Not yet worked | Not yet worked |
|  | 0 time | 0 time | 3 times | 5 times |  |  |
| Eu | 0/mm² | 7/mm² | 12/mm² | 51/mm² | Not yet worked | Not yet worked |
|  | 0 time | 0 time | 4 times | 7 times |  |  |

From the results of Table 5, it is learned that when the concentration of addition was high, with praseodymium, neodymium, lanthanum, and europium, when casting the precipitate into ingots by the one-directional solidification method, the concentration at which the precipitate was formed became higher compared with free solidification. When 0.5 μm or larger precipitates were present in a density of over 10/mm², there were several wire breaks when drawing the wire to a thinness of 18 μm.

From the above, even if produced by the one-directional solidification method, the upper limits of the praseodymium and neodymium were 0.02 mass % and the upper limits of the lanthanum and europium were 0.003 mass %.

Example 7

Various types of additive elements were combined to produce bonding wire comprised of high strength gold wire having an elongation at break of 4.0% and a tensile strength of 320 MPa or so. Beryllium and aluminum were added in amounts of 0.0003 to 0.0006 mass % and 0.0002 to 0.0004 mass % from the results of Examples 3 to 5.

The method of production and the final wire size were the same as in Example 6. Table 6 shows the ingredients (analysis values), strengths at the time of elongations at break of 3%, 4%, and 8%, and formation of precipitates. The tensile strength became smaller the larger the value of the set elongation.

This was due to the high temperature at the final heat treatment process and the recovery and recrystallization. Usually, the set elongation of the bonding wire, while depending on the application, is 3 to 8%. In this example, even when making the elongation at break 8%, the ingredients were set so as to obtain a strength of 210 MPa or more.

Table 6 shows the results of evaluation of the ball shape of the pressed balls in first bonding evaluated using bonding wire produced by adjusting the elongation at break to 4%.

The precipitates were evaluated by observing a polished cross-sectional surface of the wire in the length direction by a 1000× optical microscope, counting the number of precipitates in the same way as Example 4, and converting the number to density per 1 mm² Precipitates of a diameter of about 0.5 μm or more could be counted.

The bonding test was conducted using a chip with a pad pitch of 50 μm and a pad material of Al-1% Cu. The bonding was performed using 8028pps made by K&S in the atmosphere with a chip surface temperature of 150° C. The test was run with a pressed size of the first bonding set to 36 μm and with a loop length of 1.5 mm.

The bonding property was evaluated by measuring the shear strength and pressed ball defect rate as the first bondability.

As the criteria for defective pressed balls, the pressed sizes in a direction of application of the ultrasonic waves in the first bonding and the direction perpendicular to it were measured. Balls with a value of the pressed size in the direction perpendicular to application of the ultrasonic waves divided by the pressed size in the direction of application of the ultrasonic waves of over 1.1 and balls with recessed shapes in the pressed circumferences were judged as defective balls. The number divided by the number observed was defined as the ball defect rate.

The number of wire breaks was the number of times of breakage before drawing all of the ingot to the final wire size.

TABLE 6

Properties of Gold Wire Designed With Strength of 200 MPA With Elongation at Break of 4.0%

| | Amount added (mass ppm) | | | | | | | | | | Tensile strength (MPa) | | | Precipitate density | No. of wire | First bondability Ball defect | |
|---|---|---|---|---|---|---|---|---|---|---|---|---|---|---|---|---|---|
| No. | Pr | Ca | La | Ce | Nd | Eu | Sm | Be | Al | Au | Set elongation 3% | Set elongation 4% | Set elongation 8% | (/mm²) | breaks | rate (%) | Remarks |
| 78 | 50 |  |  |  |  |  |  | 5 | 3 | Bal. | 407 | 354 | 237 | 0 | 0 | 3 | Inv. ex. |
| 79 | 44 |  |  |  |  |  |  | 4 | 4 | Bal. | 385 | 326 | 222 | 0 | 0 | <1 | Inv. ex. |
| 80 | 38 | 13 |  |  |  |  |  | 5 | 3 | Bal. | 403 | 331 | 226 | 0 | 0 | <1 | Inv. ex. |
| 81 | 20 | 26 |  |  |  |  |  | 4 | 3 | Bal. | 396 | 329 | 223 | 0 | 0 | <1 | Inv. ex. |

TABLE 6-continued

Properties of Gold Wire Designed With Strength of 200 MPA With Elongation at Break of 4.0%

| | Amount added (mass ppm) | | | | | | | | | | Tensile strength (MPa) | | | Precipitate density ($/mm^2$) | No. of wire breaks | First bondability Ball defect rate (%) | Re-marks |
|---|---|---|---|---|---|---|---|---|---|---|---|---|---|---|---|---|---|
| | | | | | | | | | | | Set elongation 3% | Set elongation 4% | Set elongation 8% | | | | |
| No. | Pr | Ca | La | Ce | Nd | Eu | Sm | Be | Al | Au | | | | | | | |
| 82 | 10 | 40 | | | | | | 6 | 2 | Bal. | 380 | 321 | 211 | 0 | 0 | 7 | Inv. ex. |
| 83 | 5 | 50 | | | | | | 5 | 3 | Bal. | 380 | 322 | 210 | 0 | 0 | 21 | Inv. ex. |
| 84 | 34 | | 5 | | | | | 4 | 4 | Bal. | 402 | 336 | 220 | 0 | 0 | <1 | Inv. ex. |
| 85 | 31 | | 9 | | | | | 5 | 3 | Bal. | 400 | 334 | 225 | 0 | 0 | <1 | Inv. ex. |
| 86 | 16 | | 30 | | | | | 3 | 3 | Bal. | 380 | 319 | 212 | 0 | 0 | 2 | Inv. ex. |
| 87 | 15 | | 40 | | | | | 6 | 2 | Bal. | 386 | 320 | 211 | 28 | 3 | 33 | Inv. ex. |
| 88 | 11 | | 50 | | | | | 5 | 3 | Bal. | 370 | 310 | 211 | 54 | 5 | 44 | Inv. ex. |
| 89 | 29 | | | 14 | | | | 4 | 4 | Bal. | 397 | 326 | 221 | 0 | 0 | <1 | Inv. ex. |
| 90 | 10 | | | 30 | | | | 5 | 3 | Bal. | 385 | 320 | 215 | 0 | 0 | 4 | Inv. ex. |
| 91 | 5 | | | 40 | | | | 5 | 3 | Bal. | 378 | 315 | 211 | 0 | 0 | 21 | Inv. ex. |
| 92 | 31 | | | | 17 | | | 6 | 3 | Bal. | 394 | 325 | 220 | 0 | 0 | <1 | Inv. ex. |
| 93 | 11 | | | | 35 | | | 3 | 3 | Bal. | 375 | 318 | 212 | 0 | 0 | 2 | Inv. ex. |
| 94 | 4 | | | | 42 | | | 4 | 3 | Bal. | 365 | 311 | 210 | 0 | 0 | 22 | Inv. ex. |
| 95 | 31 | | | | | 25 | | 5 | 3 | Bal. | 393 | 325 | 218 | 0 | 0 | 4 | Inv. ex. |
| 96 | 10 | | | | | 38 | | 5 | 3 | Bal. | 378 | 318 | 212 | 34 | 4 | 31 | Inv. ex. |
| 97 | 6 | | | | | 48 | | 6 | 2 | Bal. | 371 | 309 | 210 | 69 | 6 | 49 | Inv. ex. |
| 98 | 31 | | | | | | 27 | 5 | 3 | Bal. | 392 | 324 | 216 | 0 | 0 | 5 | Inv. ex. |
| 99 | 10 | | | | | | 39 | 4 | 3 | Bal. | 375 | 319 | 212 | 0 | 0 | 8 | Inv. ex. |
| 100 | 5 | | | | | | 49 | 5 | 3 | Bal. | 370 | 309 | 210 | 0 | 0 | 22 | Inv. ex. |

When combining one element selected from calcium, cerium, neodymium, europium, and samarium with praseodymium, a strength equal to or higher than the case of use of praseodymium alone was obtained.

The strength was generally high with a high concentration of praseodymium. When the mass ratio of the praseodymium in the two elements was 15% or more, in particular bonding wire superior in strength and ball shape could be produced.

In particular, when combined with the easily precipitate-forming lanthanum or europium, it was learned that if adding 0.003 mass % or more where precipitates easily form, the ball shape deteriorated.

However, in the case of lanthanum, when combined with praseodymium in an amount of addition of 0.001 mass % or less, wire superior in strength and pressed shape was obtained.

Example 8

As a result of Example 7, the inventors added indium to wire superior in strength and pressed shape and investigated the effects. The method of production of the bonding wire was made the same as in Example 7 except for making the final wire size 20 μm. For the wire strength, values when the elongations at break were 3%, 4%, and 8% were used. The set elongation of the bonding wire used in the bonding test was made 4%.

The bonding test was conducted using a chip with a pad pitch of 50 μm and a pad material of Al-0.5% Cu. The bonding was performed using 8028pps made by K&S in the atmosphere with a chip surface temperature of 150° C. The test was run with a pressed size of the first bonding set to 39 μm and with a loop length of 5.0 mm. For the capillary, a 484FF-2862-R33 of Microswitch Co. was used.

The items evaluated were the first shear strength, pressing defect rate, and variations in pressed size. The variations in pressed size were determined by measuring the diameters of 50 pressed balls in the direction of application of ultrasonic waves and the direction perpendicular to it and making a comparison by the values with large standard errors. Table 7 shows the results.

TABLE 7

Characteristics of Gold Wire Designed for Strength of 320 MPa or So at 4% Elongation at Break

| | Amount added (mass ppm) | | | | | | | | Tensile strength (MPa) | | | First bondability | | Variations in pressed size | Remarks |
|---|---|---|---|---|---|---|---|---|---|---|---|---|---|---|---|
| | | | | | | | | | Set elongation 3% | Set elongation 4% | Set elongation 8% | Shear strength (mN) | Ball defect rate (%) | Standard error (μm) | |
| No. | Pr | Ca | La | Ce | Be | Al | In | Au | | | | | | | |
| 101 | 35 | 15 | | | 5 | | | Bal. | 402 | 330 | 225 | 78.0 | <1 | 0.72 | Inv. ex. |
| 102 | 35 | 15 | | | 4 | 3 | | Bal. | 401 | 331 | 225 | 77.9 | <1 | 0.62 | Inv. ex. |
| 103 | 35 | 15 | | | 6 | | 10 | Bal. | 403 | 329 | 226 | 79.1 | <1 | 0.55 | Inv. ex. |
| 104 | 36 | 14 | | | 5 | | 30 | Bal. | 401 | 330 | 225 | 79.3 | <1 | 0.50 | Inv. ex. |
| 105 | 35 | 15 | | | 5 | | 45 | Bal. | 400 | 331 | 223 | 78.0 | <1 | 0.55 | Inv. ex. |
| 106 | 34 | 15 | | | 6 | | 60 | Bal. | 401 | 331 | 224 | 77.1 | 3 | 0.77 | Inv. ex. |
| 107 | 40 | | 8 | | 7 | | | Bal. | 411 | 354 | 238 | 79.1 | <1 | 0.71 | Inv. ex. |

TABLE 7-continued

Characteristics of Gold Wire Designed for Strength of 320 MPa or So at 4% Elongation at Break

| | Amount added (mass ppm) | | | | | | | | Tensile strength (MPa) | | | First bondability | | Variations in | |
| | | | | | | | | | Set elongation | Set elongation | Set elongation | Shear strength | Ball defect | pressed size Standard error | |
| No. | Pr | Ca | La | Ce | Be | Al | In | Au | 3% | 4% | 8% | (mN) | rate (%) | (μm) | Remarks |
|---|---|---|---|---|---|---|---|---|---|---|---|---|---|---|---|
| 108 | 41 | 8 | | 6 | | | 3 | Bal. | 412 | 355 | 239 | 80.1 | <1 | 0.62 | Inv. ex. |
| 109 | 40 | 7 | | 5 | | | 20 | Bal. | 413 | 355 | 240 | 80.1 | <1 | 0.48 | Inv. ex. |
| 110 | 39 | 8 | | 6 | | | 30 | Bal. | 411 | 354 | 239 | 80.2 | <1 | 0.46 | Inv. ex. |
| 111 | 40 | 8 | | 8 | | | 40 | Bal. | 412 | 354 | 239 | 79.9 | <1 | 0.52 | Inv. ex. |
| 112 | 40 | 8 | | 6 | | | 65 | Bal. | 412 | 354 | 239 | 78.9 | 4 | 0.72 | Inv. ex. |
| 113 | 31 | | 15 | 3 | 3 | | | Bal. | 397 | 326 | 220 | 77.7 | <1 | 0.75 | Inv. ex. |
| 114 | 31 | | 14 | 3 | 4 | 3 | | Bal. | 398 | 325 | 221 | 77.7 | <1 | 0.62 | Inv. ex. |
| 115 | 30 | | 15 | 4 | 3 | | 10 | Bal. | 397 | 326 | 222 | 78.8 | <1 | 0.58 | Inv. ex. |
| 116 | 29 | | 16 | 3 | 4 | | 30 | Bal. | 398 | 327 | 221 | 80.1 | <1 | 0.51 | Inv. ex. |
| 117 | 30 | | 15 | 4 | 4 | | 48 | Bal. | 396 | 326 | 220 | 79.1 | <1 | 0.59 | Inv. ex. |
| 118 | 30 | | 14 | 3 | 5 | | 70 | Bal. | 397 | 326 | 221 | 76.5 | 7 | 0.78 | Inv. ex. |

With each wire, sufficiently good values were obtained for the first shear strength and pressing defect rate. As for the variation in pressed size, the variation in pressed size was small with an amount of addition of indium of 0.0003 mass % to 0.005 mass % in range.

INDUSTRIAL APPLICABILITY

As explained above, the gold wire for connecting a semiconductor chip of the present invention is improved in strength, bondability including the pressed shape, and looping property, enables bonding by finer wires and bonding of narrower pitches, and enables reduction of size of the semiconductor chip. Therefore, the present invention has a high applicability in the semiconductor industry.

The invention claimed is:

1. A bonding wire for connecting a semiconductor chip to an external metal terminal, said bonding wire consisting essentially of 0.0004 mass % to 0.02 mass % of praseodymium, 0.0003 mass % to 0.006 mass % of indium, 0.0002 mass % to 0.02 mass % of calcium, with the balance gold, wherein the content of praseodymium constitutes, by mass ratio, 15% or more of the total content of calcium and praseodymium, and wherein in any cross-section in the bonding wire, number of pieces of precipitates comprising 10 atomic % or more of rare earth element and the balance being gold having a length of 0.5 μm or more is 10/mm² or less.

2. A bonding wire for connecting a semiconductor chip to an external metal terminal, said bonding wire consisting essentially of 0.0004 mass % to 0.02 mass % of praseodymium, 0.0003 mass % to 0.006 mass % of indium, 0.0002 mass % to 0.02 mass % of calcium, and at least one element of:
0.0002 mass % to 0.0033 mass % of cerium,
0.0002 mass % to 0.0033 mass % of neodymium,
0.0002 mass % to 0.0033 mass % of samarium,
0.0002 mass % to 0.003 mass % of lanthanum, and
0.0002 mass % to 0.003 mass % of europium,
with the balance gold, wherein the content of praseodymium constitutes, by mass ratio, 15% or more of total content of the calcium and rare earth elements, said rare earth elements indicating lanthanide elements including praseodymium and yttrium, and wherein in any cross-section in the bonding wire, number of pieces of precipitates comprising 10 atomic % or more of rare earth element and the balance being gold having a length of 0.5 μm or more is 10/mm² or less.

3. A bonding wire for connecting a semiconductor chip to an external metal terminal as set forth in claim 1 or 2, characterized in that a content of rare earth elements other than praseodymium, cerium, neodymium, samarium, lanthanum, and europium is 0.0005 mass % or less.

4. A bonding wire for connecting a semiconductor chip to an external metal terminal as set forth in claim 1 or 2, characterized by further containing at least one of 0.0002 mass % to 0.0009 mass % of beryllium and 0.0002 mass % to 0.005 mass % of aluminum.

5. A bonding wire for connecting a semiconductor chip to an external metal terminal as-set forth in claim 1 or 2, characterized in that the unavoidable impurities of silicon, lead, lithium, and sodium are 0.0014 mass % or less.

6. A bonding wire for connecting a semiconductor chip to an external metal terminal as set forth in claim 1 or 2, characterized in that the breakage strength is 210 MPa or more.

7. A bonding wire for connecting a semiconductor chip to an external metal terminal as set forth in claim 1 or 2, characterized in that a rate of reduction in cross-section from an ingot in cast state is 98% or more.

8. A bonding wire for connecting a semiconductor chip to an external metal terminal as set forth in claim 7, characterized in that said ingot is an ingot obtained by a one-directional solidification method.

* * * * *